United States Patent [19]
Shapiro et al.

[11] Patent Number: 5,302,946
[45] Date of Patent: Apr. 12, 1994

[54] STACKED DISPLAY PANEL CONSTRUCTION AND METHOD OF MAKING SAME

[76] Inventors: Leonid Shapiro, 13055 Beachtree, Lakeside, Calif. 92040; William K. Bohannon, 9921 Carmel Mountain Rd., San Diego, Calif. 92129; Randall S. Farwell, 6920 Schilling Ave., San Diego, Calif. 92126

[21] Appl. No.: 741,584

[22] Filed: Aug. 7, 1991

Related U.S. Application Data

[63] Continuation of Ser. No. 506,621, Apr. 9, 1990, abandoned, which is a continuation-in-part of Ser. No. 472,688, Jan. 30, 1990, abandoned, which is a continuation-in-part of Ser. No. 222,144, Jul. 21, 1988, abandoned.

[51] Int. Cl.⁵ .............................................. G09G 3/36
[52] U.S. Cl. .................................... 345/88; 345/208
[58] Field of Search ................ 340/784, 805, 811, 812, 340/813, 793, 789, 765; 359/53, 55, 56, 57, 63, 75, 93, 85; 358/164, 10, 32, 60, 61, 231, 236, 160

[56] References Cited

U.S. PATENT DOCUMENTS

| | | |
|---|---|---|
| 3,703,329 | 11/1972 | Castellano . |
| 3,785,721 | 1/1974 | Harsch . |
| 3,811,751 | 5/1974 | Myer . |
| 3,863,246 | 8/1975 | Treka et al. . |
| 4,006,968 | 2/1977 | Ernstoff et al. . |
| 4,044,546 | 8/1977 | Koike . |
| 4,068,926 | 1/1978 | Nakamura . |
| 4,097,128 | 6/1978 | Matsumoto et al. . |
| 4,097,130 | 6/1978 | Cole, Jr. . |
| 4,127,322 | 11/1978 | Jacobson et al. . |
| 4,171,874 | 10/1979 | Bigelow et al. . |
| 4,232,948 | 11/1980 | Shanks . |
| 4,241,339 | 12/1980 | Ushiyama . |
| 4,251,137 | 2/1981 | Knop et al. . |
| 4,257,682 | 3/1981 | Suzuki et al. . |
| 4,299,447 | 11/1981 | Soltan . |
| 4,349,817 | 9/1982 | Hoffman et al. . |
| 4,394,069 | 7/1983 | Kaye . |
| 4,411,496 | 10/1983 | Nonomura et al. . |
| 4,416,514 | 11/1983 | Plummer . |
| 4,443,065 | 2/1984 | Funada et al. . |
| 4,487,481 | 12/1984 | Suzawa . |
| 4,547,043 | 1/1985 | Penz . |
| 4,597,636 | 7/1986 | Hoshikawa . |
| 4,608,558 | 8/1986 | Amstutz et al. . |
| 4,613,207 | 9/1986 | Fergason . |
| 4,621,261 | 11/1986 | Hehlen et al. ........................ 340/813 |
| 4,634,229 | 1/1987 | Amstutz et al. . |
| 4,642,693 | 2/1987 | Fuse et al. ............................ 358/160 |
| 4,651,148 | 3/1987 | Takeda et al. . |
| 4,652,101 | 3/1987 | Grunwald . |
| 4,659,183 | 4/1987 | Suzawa . |
| 4,671,634 | 6/1987 | Kizaki et al. . |
| 4,686,562 | 8/1987 | Yamanaka ............................ 358/164 |
| 4,697,884 | 10/1987 | Amstutz et al. . |
| 4,701,786 | 10/1987 | Yamanaka ............................. 358/32 |
| 4,722,593 | 2/1988 | Shimazaki . |
| 4,723,840 | 2/1988 | Humbert et al. . |
| 4,726,663 | 2/1988 | Buzak . |
| 4,745,406 | 5/1988 | Hayashi et al. . |

(List continued on next page.)

FOREIGN PATENT DOCUMENTS 49736 8/1986 Japan .
286819 5/1988 Japan .

OTHER PUBLICATIONS

Uchida Tatsuo, "Color LCDs: Technical Developments," Japan Display '83 pp. 202–205.

(List continued on next page.)

Primary Examiner—Ulysses Weldon
Assistant Examiner—Steve Saras

[57] ABSTRACT

A new display panel system includes a stacked display panel and drive units therefor. The drive units include a computer for adjusting for the individual gamma characerics of each one of the display panels for color balancing purposes and for causing the luminance of each panel to be maximized, or at least greatly increased for each intensity level or shading of each color.

16 Claims, 10 Drawing Sheets

U.S. PATENT DOCUMENTS

| | | |
|---|---|---|
| 4,756,604 | 7/1988 | Nakatsuka et al. |
| 4,758,818 | 7/1988 | Vatne . |
| 4,769,639 | 9/1988 | Kawamura et al. ............... 340/811 |
| 4,770,500 | 9/1988 | Kalmanash et al. |
| 4,770,525 | 9/1988 | Umeda . |
| 4,796,978 | 1/1989 | Tanska et al. |
| 4,812,034 | 3/1989 | Mochizuki et al. |
| 4,813,770 | 3/1989 | Clerc et al. |
| 4,832,461 | 5/1989 | Yamagishi et al. |
| 4,838,655 | 6/1989 | Hanahata et al. |
| 4,850,681 | 7/1989 | Yamanobe et al. |
| 4,906,984 | 3/1990 | Takeda et al. ...................... 340/784 |
| 4,962,376 | 10/1990 | Inoue et al. ......................... 340/805 |

OTHER PUBLICATIONS

Yamagishi article, "A Multicolor Projection Display Using Nematic–Cholesteric Liquid Crystal" 1988 IEEE Ch–2678–1/88/0000–0204, pp. 204–207.

Y. Takahashi, T. Uchida and M. Wada, "The Effect of Various Parameters on TN–LCDs," Mol. Cryst. Liq. Cryst., 1981, vol. 66, pp. 171–182.

K. Kinugawa et al., "640×400 Pixel LCD Using Highly Twisted Birenfringence Effect with Low Pretilt Angle." STD 86, Digest, pp. 122–125.

T. J. Scheffer et al., "24×80 Character LCD panel Using the Supertwisted Birefringence Effect," SID 85 Digest, pp. 120–123.

Mitsuo Nagata and Hiroshi Wada, "Neutralized Supertwisted Nematic LCD: Principle and Characteristics," Nov. 1988, The Transactions of the IEICE vol. E71, No. 11, pp. 1080–1085.

FIG. 10

STACKED DISPLAY PANEL CONSTRUCTION AND METHOD OF MAKING SAME

CROSS REFERENCE TO RELATED APPLICATIONS

This is a continuation of application Ser. No. 07/506,621, filed on Apr. 9, 1990 entitled "STACKED DISPLAY PANEL CONSTRUCTION AND METHOD OF MAKING SAME" which is a continuation-in-part of U.S. patent application Ser. No. 07/472,688 filed Jan. 30, 1990, entitled "LIQUID CRYSTAL DISPLAY PANEL SYSTEM AND METHOD OF USING SAME", which is a continuation-in-part of U.S. patent application Ser. No. 07/222,144 filed Jul. 21, 1988 entitled "GRAY SCALE SYSTEM FOR VISUAL DISPLAYS" all three applications now abandoned. The foregoing patent applications are incorporated herein by reference.

TECHNICAL FIELD

The present invention relates, in general, to a stacked display panel system and a method of making it, in an improved manner. More particularly, the present invention relates to a stacked liquid crystal display panel system and method of making it, to improve the quality of the light images produced thereby.

BACKGROUND ART

Large screen projection displays have been in demand for use in meetings, eduction, and for public announcement. Such systems are typically used in brightly lighted locations such as offices, airport lobbies and other public places. Thus, a bright screen with multicolored images is very important.

To satisfy the demand for such display systems, several types of liquid crystal display panel systems have been proposed. Such systems, however, have typically been limited in the number of different colors produced, or have exhibited poor contrast ratios. Such limitations result from various factors. For example, the physical and electrical characteristics of the individual liquid crystal display panel assemblies for producing colors, typically vary in actual production.

In a stacked display panel construction, a series of display panels and associated polarizers or filters are arranged along an optical path. The relative luminance of the individual panels is also effected by the order in which the panel assemblies are disposed within a stacked arrangement; i.e., a panel disposed more closely to the light source generally exhibits greater light transmittance characteristics as compared to a panel which is disposed more remotely from the light source along the common optical path because of the induced heating by the light source.

Another problem with conventional liquid crystal display panel systems is that the light transmission characteristics of the individual panels in a stacked panel arrangement, also vary in actual production. Consequently, the contrast levels of a multiple number of panels arranged along an optical path, does not follow in a linear manner, thereby resulting in color distortion.

Not only do the abstract values differ from panel to panel in a stacked configuration where each panel is responsible for a portion of the visible color spectrum, but also the excitation or gamma curves (applied voltage versus relative luminance) for each panel vary widely in significant manners. Accordingly, even if the panels could somehow be matched at one intensity or shading level, it would be difficult, if not impossible, to cause the contrast levels of the stacked panel arrangement to be balanced from one panel to the next, in a stacked panel arrangement.

Because typical liquid crystal display panel exhibits a hysteresis effect as a function of the applied voltage, different hues or shades of color can be produced by multiplexing the individual pixels or by applying incremented voltage steps between the excited and unexcited states of the panel. While such a technique may produce colors with multiple hues, it has been difficult, if not impossible, for such panel systems to produce a large number of different colors with multiple shading levels, because the relative luminance between the different colored panel assemblies varies to such a great extent.

For example, in U.S. Pat. No. 4,416,514, there is disclosed a liquid crystal color filter, which includes a set of differently colored dichroic polarizers interposed with an equal number of voltage responsive twisted nematic liquid crystal cells, and a neutral polarizer. Each of the above described elements are arranged along an optical path in a predetermined manner for modifying the spectral content of visible light incident to the filter to produce any one of eight predetermined colors. Shades of the predetermined colors are achieved by varying the voltage applied to the individual liquid crystal cells.

While the above described patented system may produce a full colored display image, it was limited to only an eight color system, since it would be difficult, if not impossible, to balance the filter colors for different hues on a pixel by pixel basis, as the light transmission characteristics of each of the liquid crystal display panels vary slightly, due to manufacturing inconsistencies between like panels and due to the physical and electrical characteristics of the panels. Thus, color balancing for the entire unit is generally unsatisfactory for some applications. More particularly, if the generating voltage levels are varied by same amount for each panel, each panel will have a different amount of relative luminance, thereby resulting in a distortion of the resulting colored image on a pixel by pixel image basis.

SUMMARY OF THE INVENTION

Therefore, the principal object of the present invention is to provide a new and improved display panel system, and a method of making it, to produce improved light image characteristics, and yet be able to manufacture such a system according to modern mass production techniques.

Another object of the present invention is to provide such a new and improved display panel system, and a method of making it, wherein the system includes a stacked display panel construction, and wherein the display panel stages or assembles are balanced optically from assembly to assembly.

Briefly, the above and further objects are realized by providing a new and improved display panel system.

A new display panel system includes a stacked display panel and drive units therefor. The drive units include a computer for adjusting for the individual gamma characterics of each one of the display panels for color balancing purposes and for causing the luminance of each panel to be maximized, or at least greatly increased for each intensity level or shading of each color.

BRIEF DESCRIPTION OF DRAWINGS

The above mentioned and other objects and features of this invention and the manner of attaining them will become apparent, and the invention itself will be best understood by reference to the following description of the embodiment of the invention in conjunction with the accompanying drawings, wherein.

BEST MODE FOR CARRYING OUT THE INVENTION

Figure 1:
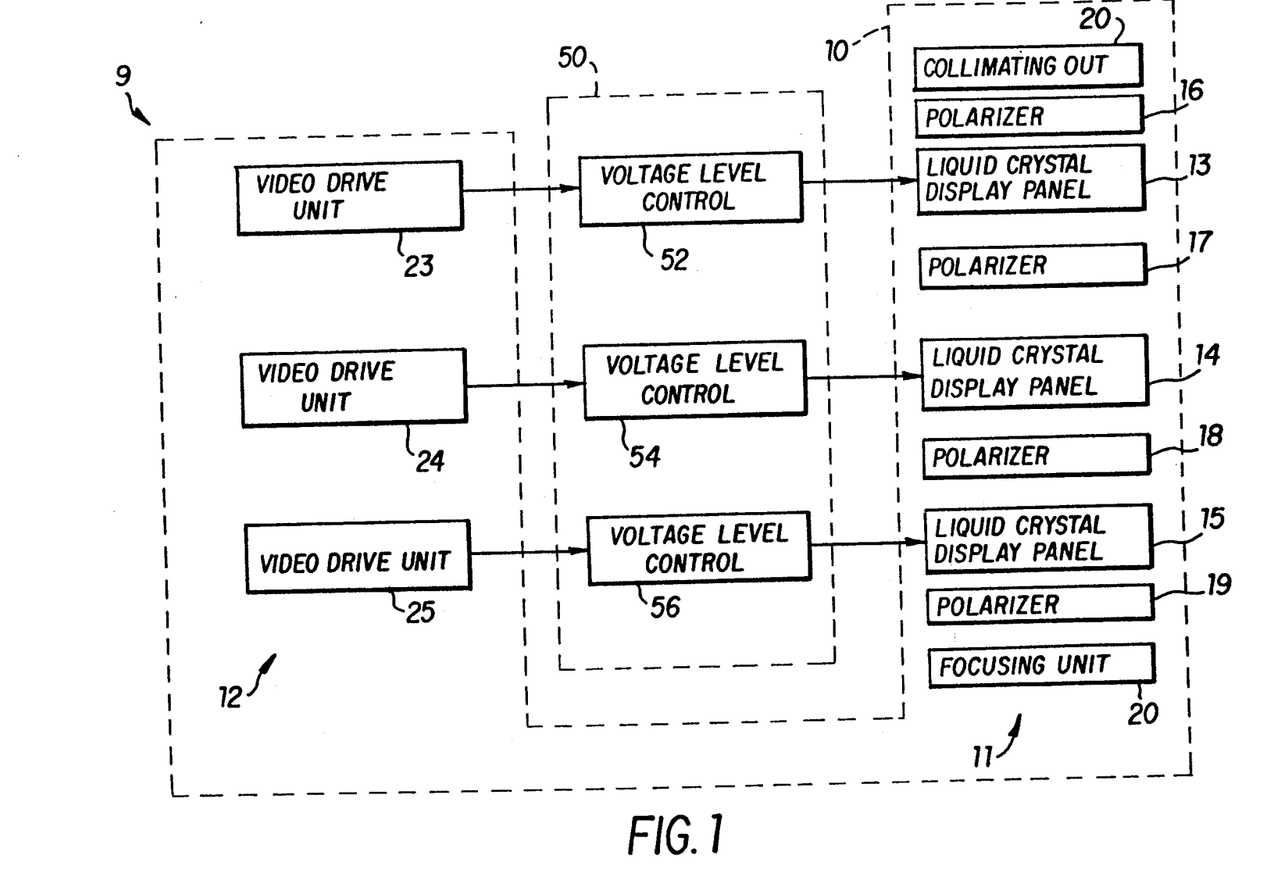
FIG. 1 is a block diagram of a display panel system, which is constructed in accordance with the present invention.

Referring now to FIG. 1, there is shown display panel system 9, which is constructed in accordance with the present invention, and which produces multicolored display images.

The display panel system 9 generally comprises a liquid crystal display panel assembly 10, which includes a liquid crystal display panel construction, shown generally at 11 and a video processing unit 12 which are more fully described in copending U.S. patent application Ser. No. 07/506,429 filed concurrently herewith, and foregoing mentioned U.S. patent application Ser. No. 07/472,668 which are incorporated herein by reference.

The panel construction 11 includes a set of liquid crystal display panels 13, 14, and 15 which are disposed along a common optical path, which includes a collimating unit 20 and focusing unit 21 for directing light along the common optical path. The panel construction 11 also includes a set of spaced apart polarizers 16, 17, 18, and 19 which are also interleaved with, and optically aligned with the display panels 13, 14, and 15 along the common optical path.

The gamma curve adjustment system 10 generally comprises a linearization network 50 having a set of voltage level control circuits 52, 54, and 56 connected to the respective ones of the display panels 13, 14, and 15, for adjusting the initial direct current voltage applied to each one of the respective liquid crystal display panels to utilize substantially the full gamma curve characteristic for each respective panels, as will be explained hereinafter in greater detail. The linearization network 50 also tacks or follows the respective gamma curves characteristic for each one of the panels 13, 14, and 15, to permit the contrast level of the panel assembly 11 to be adjusted, without color distortion as will be explained hereinafter in greater detail.

Each of the voltage level control circuits 52, 54, and 56 is coupled between the individual liquid crystal display panels 13, 14, and 15 respectively, and a set of associated video drive units 23, 24, and 25 respectively. The drive units 23, 24, and 25 form part of the video processing unit 12. Each of the video drive units 23, 24, and 25 are also coupled to their respective liquid crystal display panels 13, 14, and 15 by suitable means (not shown), and are more fully described in the foregoing mentioned copending U.S. patent application Ser. No. 07/472,668.

Each one of the liquid crystal display panels is used for a different color, and exhibits a different relative luminance as a function of the voltage applied to the respective liquid crystal display panels, such as panels 13, 14, and 15.

Figure 4:
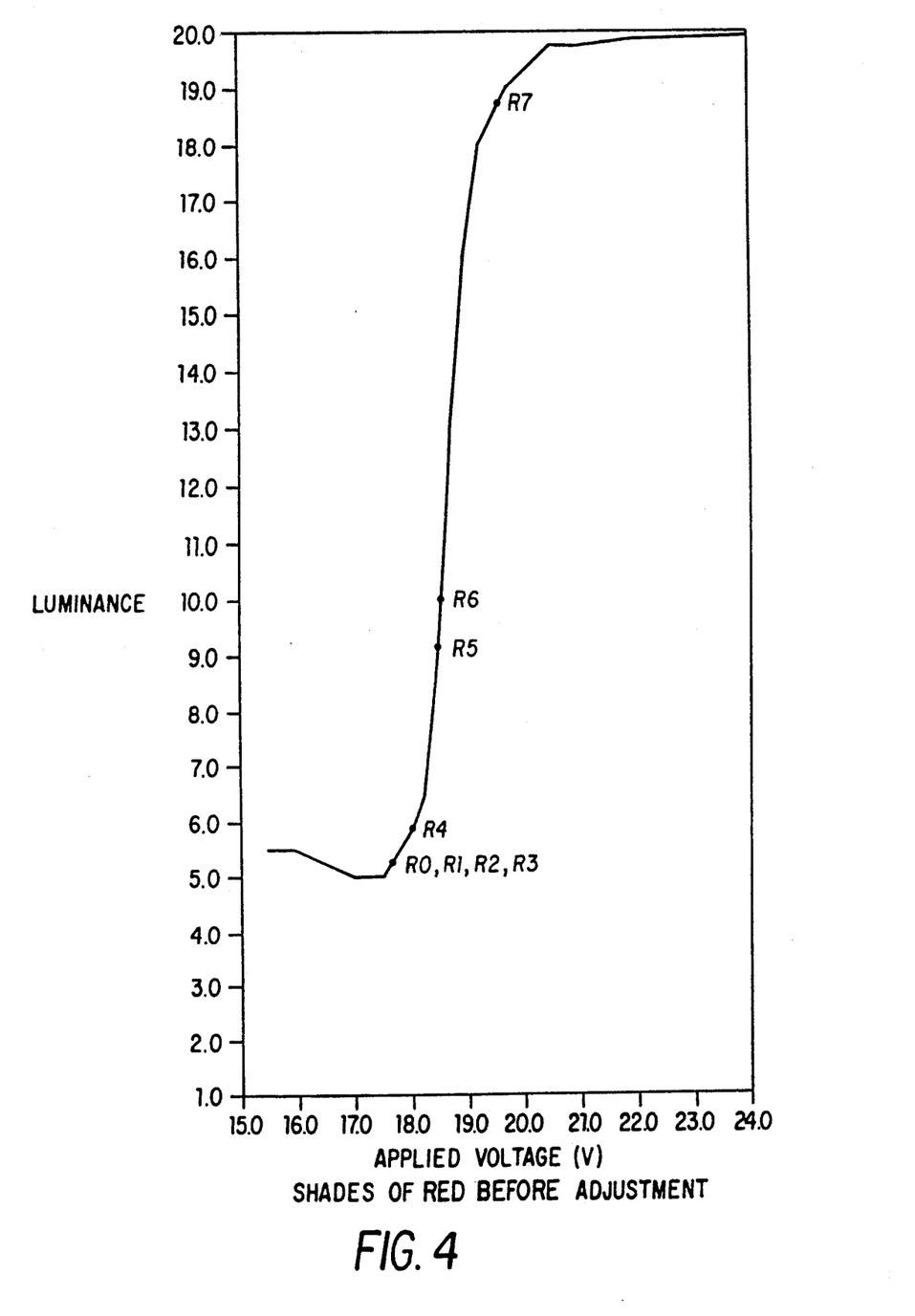
FIGS. 4–10 are graphs useful in the understanding of the present invention.
Figure 5:
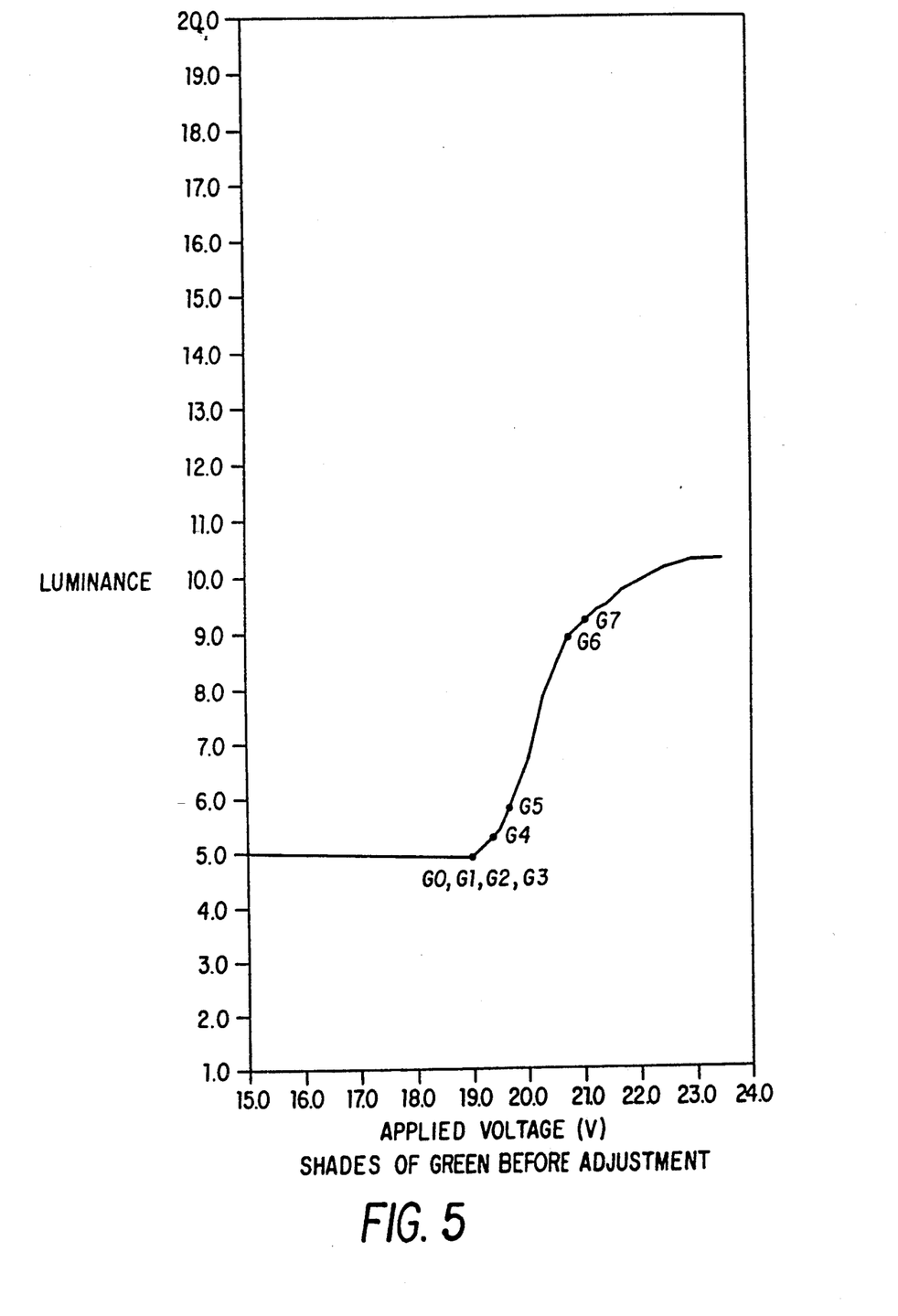
Figure 6:
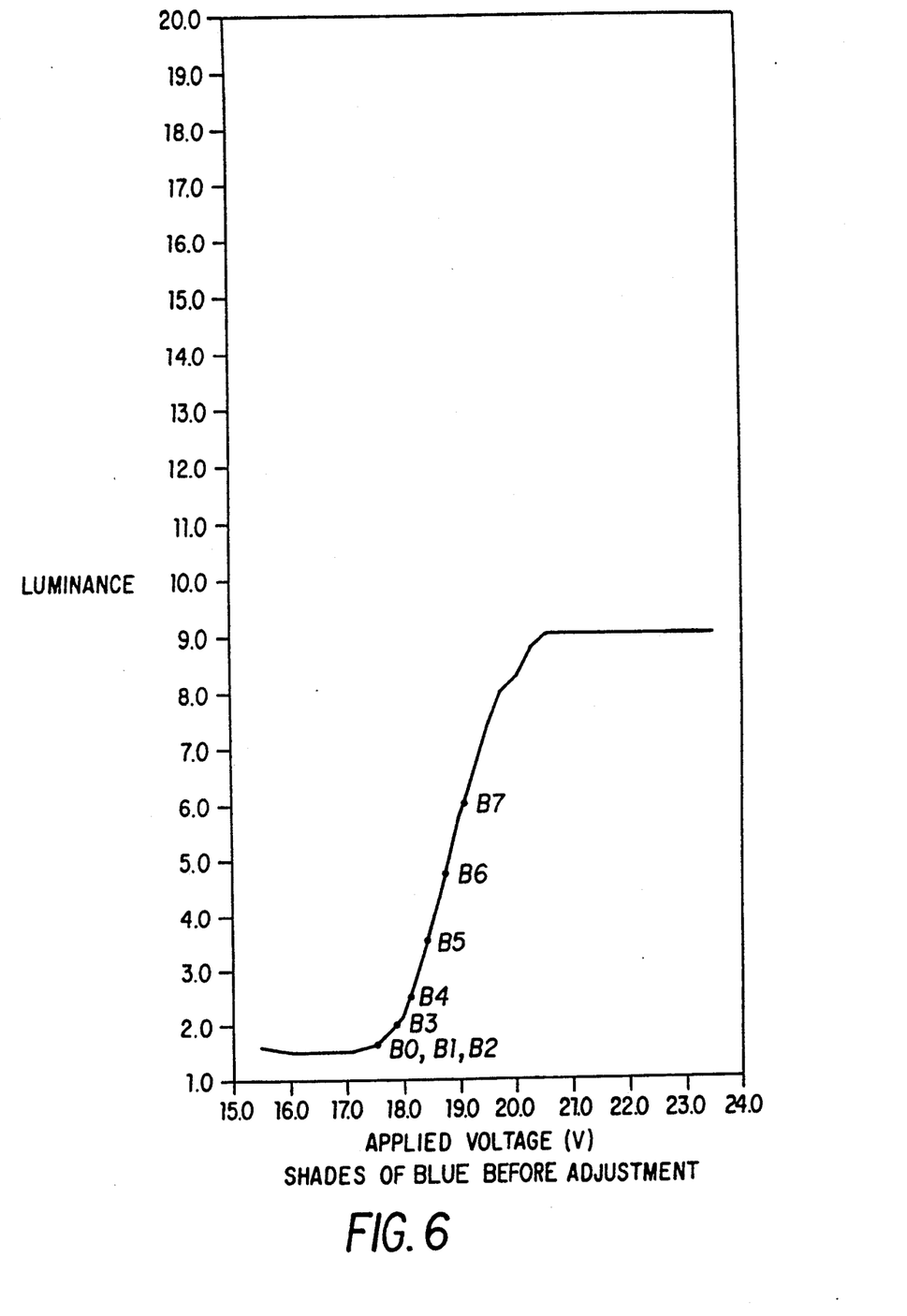
Figure 7:
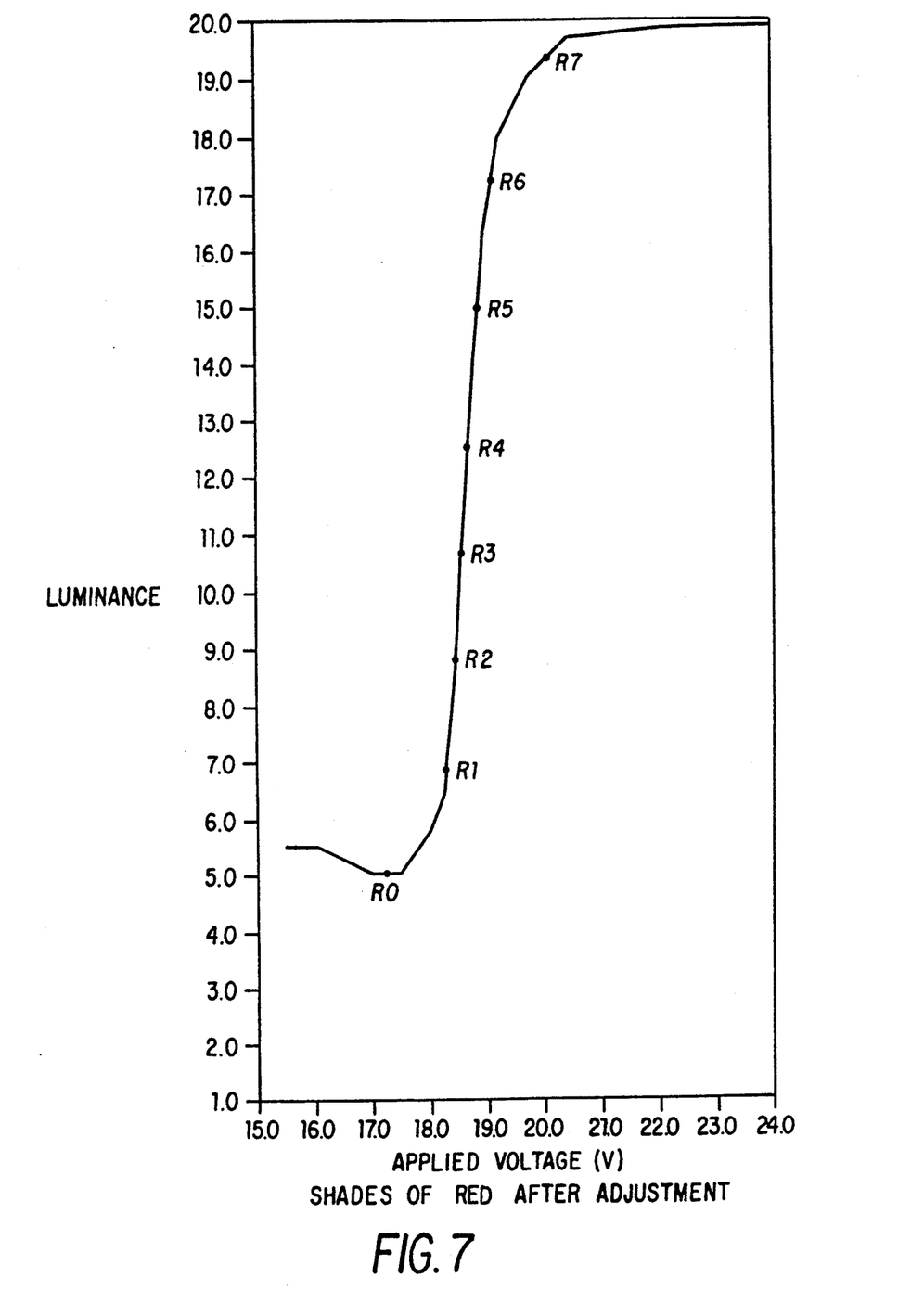
Figure 8:
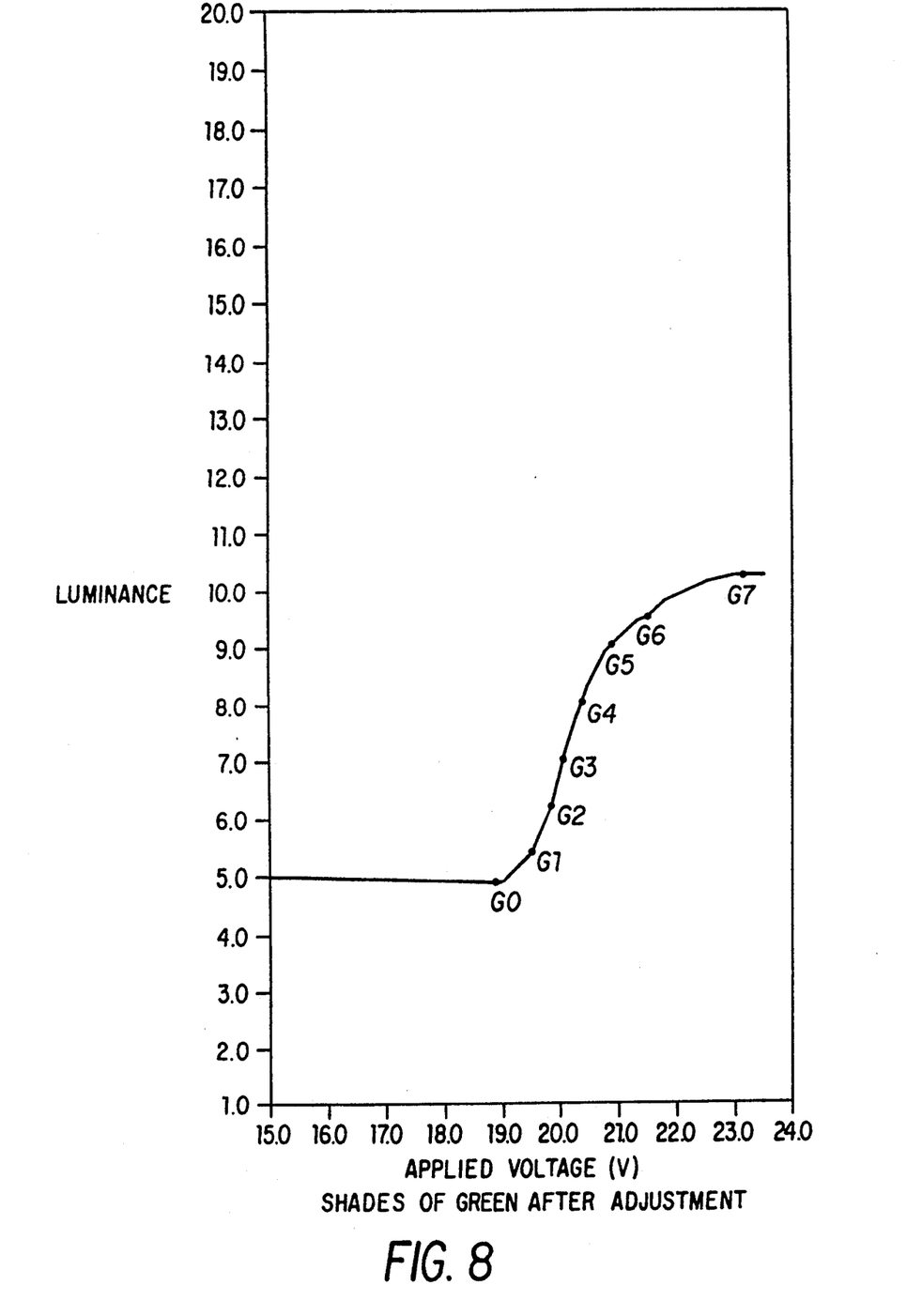
Figure 9:
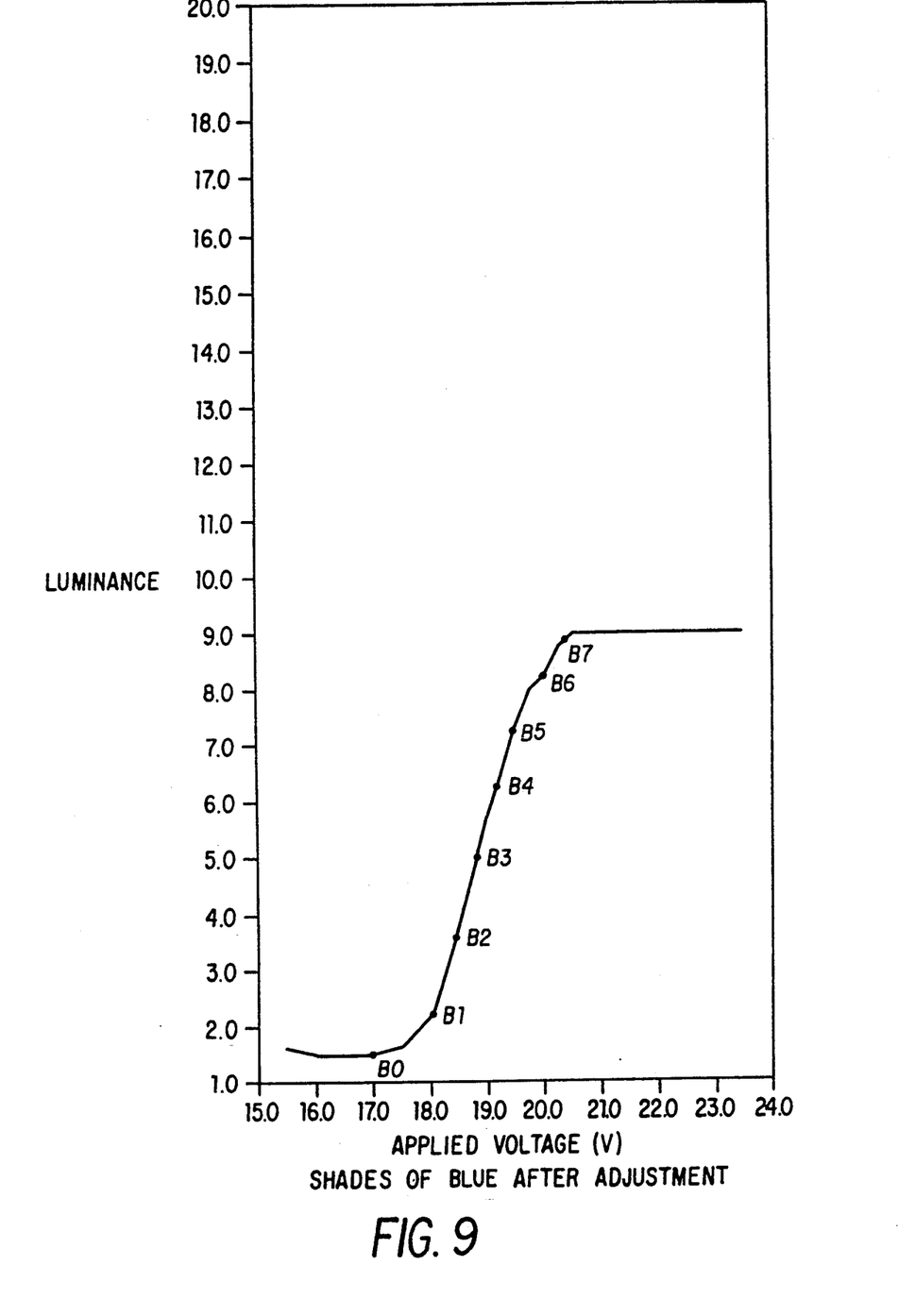
Figure 10:
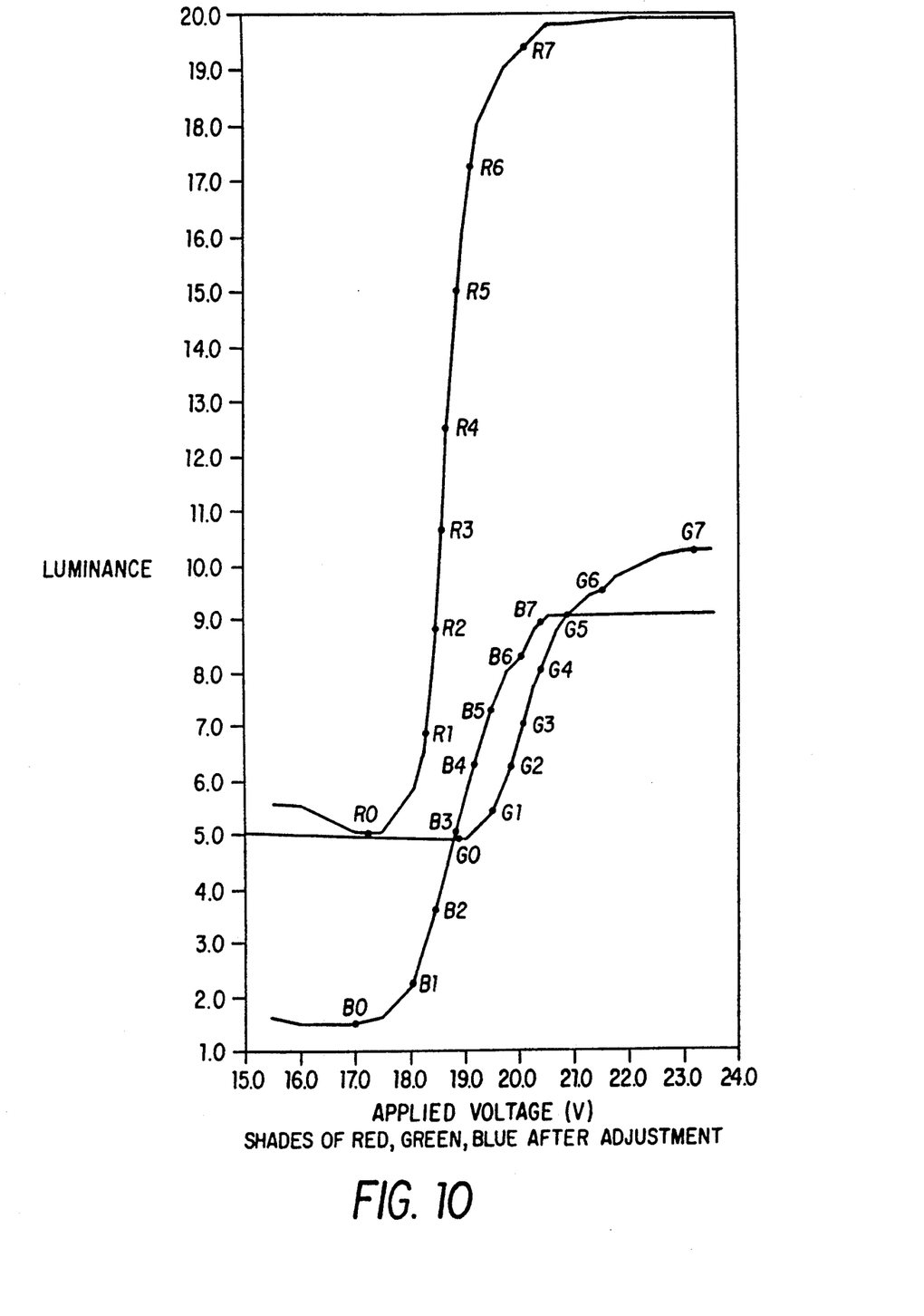

FIGS. 4, 5, and 6 show three typical gamma curves 28, 30, and 32 for panels 13, 14, and 15 respectively. As each of these curves is substantially identical in form, only gamma curve 28 will be described hereinafter in greater detail. In operation, the individual voltage level control circuits 52, 54, and 56 are adjusted to provide an initial direct current reference voltage ($V_{ref}$) for their respective liquid crystal display panels 13, 14, and 15, to enable a maximum amount, if not a high percentage of relative luminance to be produced by each of the panels 13, 14, and 15. Thus, according to the present invention, the assembly 10 enables a high percentage, if not a maximum percentage, of luminance to be achieved for each level of color intensity displayed for each pixel.

Considering now the linearization network 50 in greater detail with reference to FIGS. 1 and 2, each of the voltage level control circuits 52, 54, and 56 are similar to one another, except as will be explained hereinafter in greater detail. Accordingly, with reference to FIG. 2, only control circuit 56 will now be described.

Figure 2:
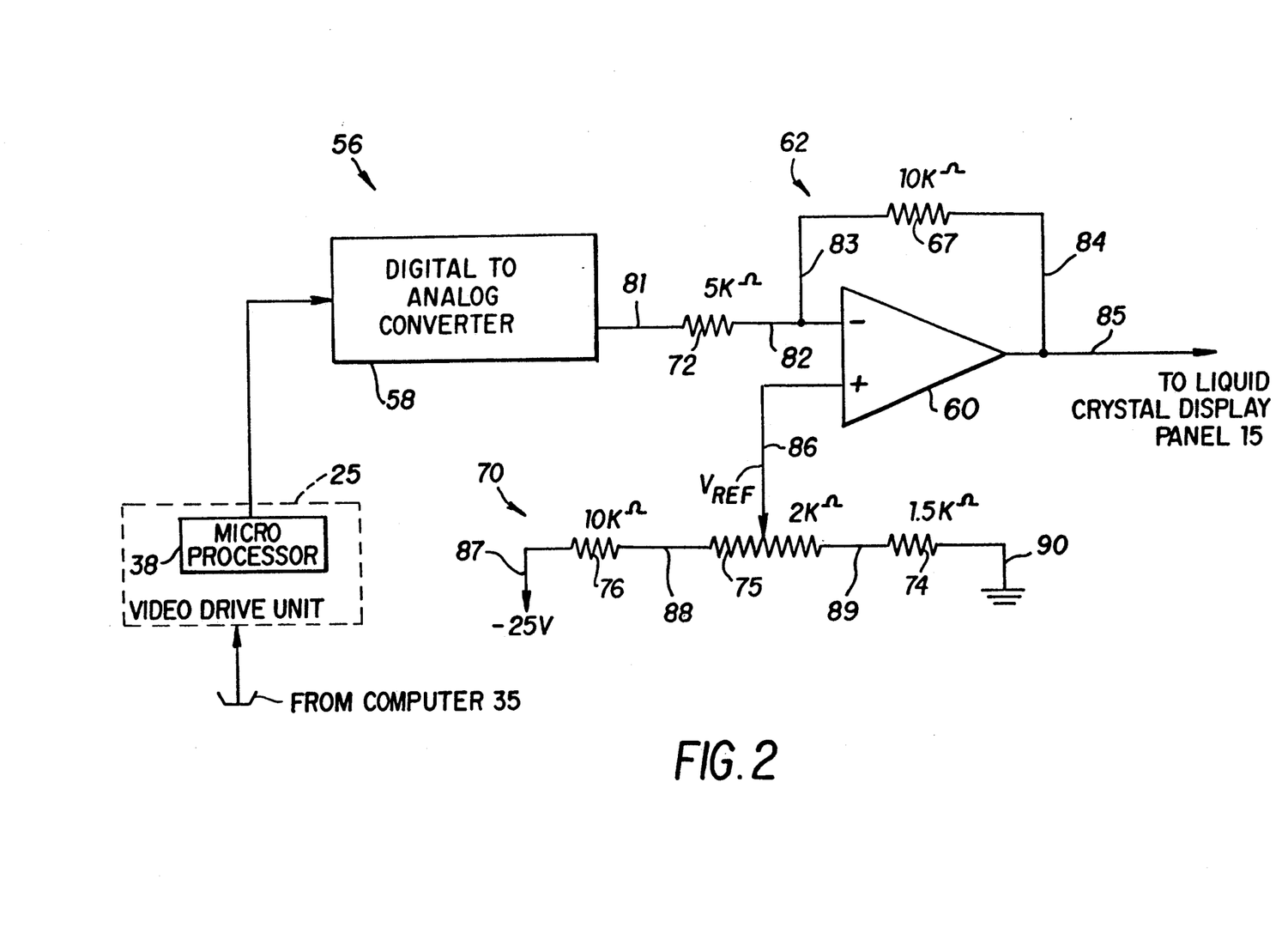
FIG. 2 is a symbolic block circuit diagram of a voltage level control unit of the system of FIG. 1.

Considering now the voltage level control circuit 56 in greater detail with reference to FIG. 2, the voltage level control circuit 56 is responsive to digital signals supplied by a microprocessor 38 disposed within the video drive unit 25. As more fully explained in the foregoing mentioned pending patent applictions, each one of the digital signals supplied by the microprocessor 38 is indicative of a given shading or color level for a displayable pixel forming part of the image produced by the panel assembly 10. More particularly, the voltage level control circuit 56 supplies a selected operating voltage level to the panel 15, which, in turn, enables each displayable pixel to be displayed with a maximum, if not a relative high percentage of relative luminance for helping to contrast one shading level from another.

In order to convert the digital signals supplied by the microprocessor 38 into an operating voltage level to maximize contrasting shading levels, the voltage level control circuit 56 includes a digital to analog converter 58 for converting digital signals from the computer 38, into analog voltage levels indicative of the different panel operating voltage levels for each color intensity level, to maximize, or at least to increase greatly the luminance of contrasting shading levels.

The voltage level control circuit 56 also includes a differential amplifier 60 for amplifying the analog voltage signal supplied by digital to analog converter 58 into an appropriate operating voltage level for the panel 15. In this regard, the control circuit 56 also includes a feedback gain control arrangement 62 for determining the amount of gain for the input signal to the amplifier 60.

In order to adjust the direct current reference voltage $V_{ref}$ on lead 86 for panel 15, relative to the various operating voltage levels for the panel, the voltage level control circuit 56 also includes a direct current voltage offset arrangement 70.

Considering now the digital to analog converter 58 in greater detail with reference to FIG. 2, the digital to analog converter 58 tend to maximize the number of discrete operating voltage levels between the threshold voltage level $V_T$ and the saturation voltage level $V_{SAT}$. The digital to analog converter 58 is also selected to have discrete voltage level steps or increments, which are balanced with the voltage increment levels produced by the digital to analog converters in each of the other control circuits 52 and 54. It should, therefore, be understood that the digital to analog converters of each one of the control circuits perform similar functions but will necessarily have different voltage increment step capabilities to compensate for the individual operating characteristics of their corresponding display panels 13, 14, and 15 respectively.

Considering now the feedback gain arrangement 62 in greater detail with reference to FIG. 2, the feedback gain arrangement includes two current limiting resistors 67 and 72 which are selected to cause the differential amplifier 60 to amplify the output voltage from the digital to analog converter 58, to an appropriate voltage. In this regard, like the digital to analog converters, the resistance values of the resistors in the other feedback gain arrangements for control circuits 52 and 54, may be different than the resistance values of resistors 67 and 72, although they perform a similar function.

As best seen in FIG. 2, the resistor 72 connects the output of the digital to analog converter at 81 to the negative or inverting input 82 of the differential amplifier 60. The negative or inverting input 82 of the amplifier 60 is also coupled through resistor 67 via conductors 83 and 84 to an output 85 of the amplifier 60. Resistor 72 is a 5 kohm resistor while resistor 67 is a 10 kohm resistor.

Considering now the differential amplifier 60 in greater detail with reference to FIG. 2, the output 85 of the amplifier 60 is connected to the liquid crystal display panel 15 to provide a selected operating voltage for attempting to maximize contrasting shading or color levels, so that each pixel energized at one level will be easily distinguished from every other pixel energized at different shading levels of the same basic color.

In order to provide a differential voltage level reference as well as to provide a direct current voltage level reference for utilizing to the fullest extend possible the full gamma curve of the panel 15 to be utilized in response to changing shading or color levels, the noninverting or positive input of the amplifier 60 is coupled to the offset adjustment arrangement 70 by a conductor 86.

Considering now the offset adjustment arrangement 70 in greater detail with reference to FIG. 2, the offset arrangement 70 consist of a manually adjustable potentimeter 75 which has its wiper or tap connected to the noninverting input of amplifier 60 by the conductor 86.

The offset arrangement also includes a pair of voltage divider resistor 74 and 76 for providing the proper reference voltage to the amplifier 60 as a function of the resistance setting of potentimeter 75.

Resistor 74 is coupled to ground by conductor 90 and the potentimeter 75 by conductor 89. The resistor 76 is coupled to a negative voltage source (not shown) by conductor 87 and the opposite terminal of potentimeter 75 by conductor 88. Resistor 74 is a 1.5 Kohm resistor, resistor 76 is a 10 Kohm resistor and potentimeter 75 is a 2.0 Kohm potentimeter.

Considering now the operation of the system 9 in greater detail with reference to the gamma curves illustrated in FIGS. 4 to 10. The gamma curve 28 illustrates the relative luminance of panel 13 as a function of the voltage applied by the voltage level control circuit 52 to the panel 13.

Figure 3:
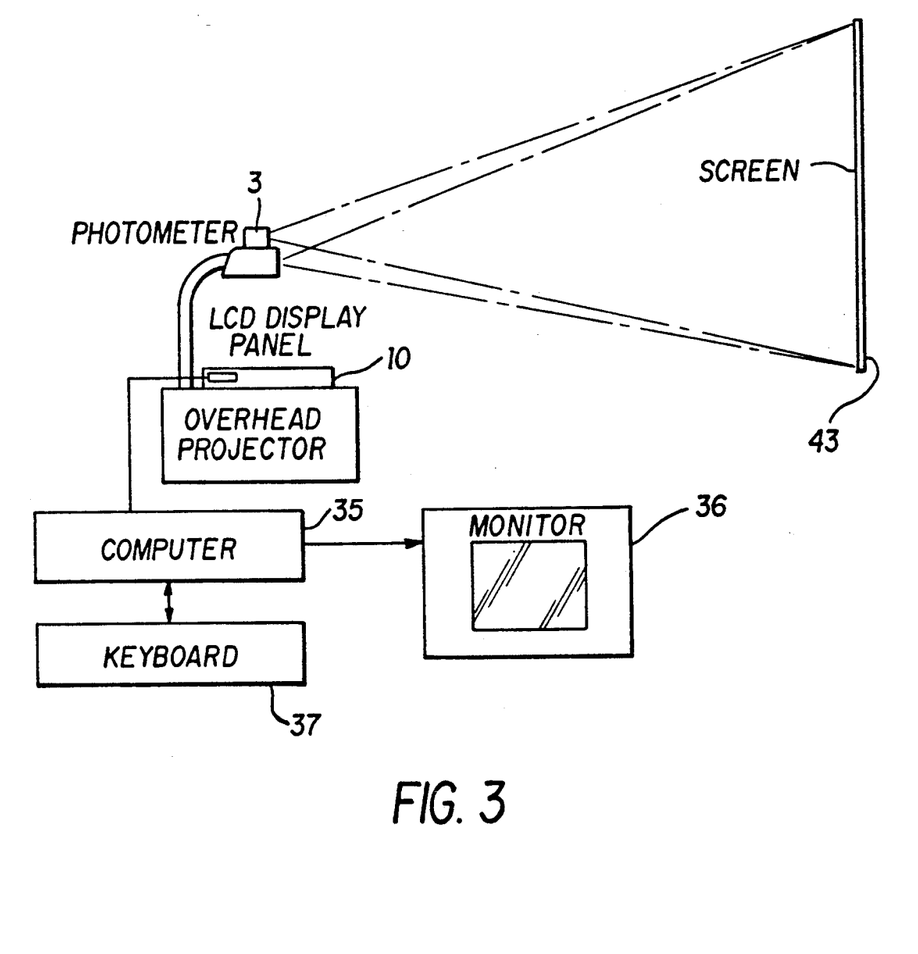
FIG. 3 is a diagrammatic and block diagram view of a display panel construction of the system of FIG. 1, illustrating it being used in a conventional overhead projector as controlled by a computer.

The gamma curve 28 is developed by positioning the liquid crystal display panel assembly 10 on an overhead projector 40 and focusing the light output of the system 10 into the projection lense of the overhead projector 40 to display an image (not shown) on a viewing screen or surface 43. The light source of the overhead projector 30 directs light into the collimating unit 20 for collimating the light. The system 10 is then electrically activated so that each panel (and all the associated displayable pixels within the panels) 13, 14, and 15 is placed in a saturated state by their associate voltage level control circuits 52, 54, and 56 respective, thus, enabling the panel construction 11 to pass noncolored light or light exhibiting the maximum relative luminance. This maximum relative luminance has an associated direct current reference or saturation voltage ($V_{SAT}$) which is measured by a user and record to form part of the gamma curve 28.

A processor program 100 is then activated by a user to cause the microprocessor 30 to generate a test pattern for displaying on the screen 43. The test pattern consists of three sets of discrete shading or color level setting, one set for each respective panel. Each set is substantially identical so only one will be described hereinafter.

Depending upon the type of computer that is driving the system 9, various shades of colors will be available. For example, a computer 35 (FIG. 3) is capable of producing at least 8 different shades of color where each shade is represented by a discrete digital code. These discrete colors are capable of being combined either in graphic or text form by the computer 35 to produce a display image which may be displayed on the screen of an associated video monitor; such as monitor 36 or on the viewing screen 43. Ideally the shading or contrast levels in the displayed images should be substantially the same as between the image displayed on the monitor 36 and the image displayed on the screen 43. The processor program 100 enables the system 9 to be adjusted so that the full gamma curve 28 can be utilized so the system 9 can produce a full spectrum with colors.

As each level of shading or color is sequentially displayed on the screen 42, a user manually adjusted the reference potentimeter, such as potentimeter 75, to vary the direct current voltage applied to the panel 13 and using a photometer 45 measures the relative luminance with calibrated red, blue and photic filters of the panel 13 as a function of the applied voltage.

The program 100 generates a test pattern of 8 discrete shading or color levels and causes the drive units to generate signals for producing on a screen by screen basis each individual discrete level within the 8 discrete levels. The program code for program 100 is assembled in 870451 assembly language and is attached to this application as appendix A and represents the actual relative luminance of the panel 13 for each of the individual 8 shading or color levels as measured by a user.

To obtain each plotted point, the selected level is displayed and then using the photometer the relative red, green, or blue luminance of the screen 43 is measured as the potentimeter 75 is varied between $V_T$ and $V_{SAT}$. Whenever the relative luminance for the displayed level is distinguished from the next lower level, the measured relative luminance is recorded.

As the test pattern starts with maximum color level (level 0), this represents the darkest shade and the relative luminance will be a function of the threshold voltage (VT). This relative luminance level is also recorded as a function of the applied voltage to form another part of the gamma curve.

Ideally, to provide the greatest contrast between levels 0 and level 7, levels 0 to 7 should be equally spaced apart on the gamma curve 28 between $V_T$ and $V_{SAT}$. The gamma curve in FIG. 3 part of the gamma curve as a function of the applied voltage that permitted the maximum luminance for the displayed level to be distinguished from the next lowest level.

The above disclosed process is repeated until all 8 levels of shading have been recorded to produce the gamma curve 28. The process is then repeated for the other panels to produce the other gamma curves 30 and 32. It should be noted that when recording the relative luminance level of the panels 13, 14, and 15, blue, red, and green filters (not shown) are used in the photometer 34 for recording the relative luminance as a function of applied voltage.

As best seen in FIG. 4 with respect to the individual shading levels of the blue panel 13, certain of the shading levels 0-3 were not distinguished from relative luminance at the threshold voltage level. Moreover, the upper shading level 7 was not disposed near the saturation voltage level. Thus, the full gamma curve is not utilized.

Comparing the green panel between threshold voltage of $-17.5$ volts and the saturation voltage of $-21.5$ volts, the relative luminance varied between 5.0 cd/m$^2$ and 10.5 cd/m$^2$.

From the foregoing, it should be clear that the step voltage changes vary substantial between different panels. To compensate for these differences, each of the d/a converters associated with the voltage level control circuits, such as d/a converter 58 have different step voltage responses that are selected to balance the color contrast between the panels 13, 14, and 15.

In order to enable a user to achieve the contrast balance, the user may press a selected function key on a keyboard or utilize other equivalent means such as a remote control infrared transmitter coupled to the microprocessor 38 by an infrared link.

Attached hereto as Appendix A is a source code listing of a firmware computer program stored in the microprocessor 38 for controlling the operation of the system 9. At pages 21, 43 through 49 of the appended Appendix A, there is disclosed the source code for controlling the tracking operation.

Therefore, the system 9 enables eight optimum operating levels for each one of the three color stages. In this regard, when the computer 35 calls for a given duty cycle level of color intensity to be generated by a given panel as explained in the foregoing patent applications, the microprocessor 38 provides a direct current bias signal for the given panel to bias the operation of the panel at the top of the luminance curve, so that when the computer 38 calls for a given intensity level, that designated level is optimized, since the intensity level voltage supplied to the panel is off-set by the d.c. bias voltage from the There is no intention, therefore, of limitations to the exact abstract or disclosure herein presented.

What is claimed is:

1. A display system for substantially optimizing distinguishable liquid crystal shading level pixel images, comprising:

liquid crystal display panel means having a plurality of electrically operable pixel elements for displaying a color image;

said panel means being interposed between a pair of polarizers that cooperate with said panel means for permitting a given portion of the visible light spectrum to pass to form said color image;

gray scale means for energizing said display panel means with a gray scaled drive signal, said drive signal causing said plurality of pixel elements to be energized to either a fully on selected state or a fully off deselected state;

said drive signal being duty cycled over a large number of frames to cause said plurality of pixel elements to produce pixel images having a large number of shading levels;

said large number of color shading levels including a maximum color shading level and a minimum color shading level;

direct current voltage level control means for applying a select bias voltage signal to said panel means to facilitate maximizing substantially the luminance of each pixel image;

said plurality of electrically operable pixel elements being electrically energized by both said drive signal and said select bias voltage signal;

contrast means for adjusting said select bias voltage signal to an optimum level to cause the pixel images produced by said plurality of pixel elements to exhibit substantially maximum luminance when said pixel elements are energized by said drive signal to said maximum color shading level;

whereby the color contrast between each of said large number of color shading levels is substantially optimized.

2. A system according to claim 1 wherein said contrast adjustment means includes:

digital to analog converter means for generating analog signals indicative of the direct current voltages to be applied to said panel to substantially optimize the color contrast of said panel; and a differential amplifier responsive to said analog signals for generating said direct current voltages for said liquid crystal display panel.

3. A display system according to claim 1 wherein said liquid crystal display panel means is a liquid crystal display panel.

4. A display system according to claim 3, wherein said liquid crystal display panel has two controllable modes of operation in response to said drive signal, at least one of said modes being a non-white mode.

5. A display system according to claim 3, wherein said liquid crystal display panel is a nematic liquid crystal display panel.

6. A display system according to claim 5, wherein said nematic liquid crystal display panel is a twisted nematic liquid crystal display panel.

7. A display system according to claim 5, wherein said nematic liquid crystal display panel is a highly twisted nematic liquid crystal display panel.

8. A display system according to claim 5, wherein said nematic liquid crystal display panel is a supertwisted nematic liquid crystal display panel.

9. A display system according to claim 8, wherein said liquid crystal display panel in cooperation with its associated polarizers passes non-colored light and colored light, said colored light being substantially in the yellow color spectrum of visible light.

10. A display system according to claim 8, wherein said liquid crystal display panel in cooperation with its associated polarizers passes non-colored light and colored light, said colored light being substantially in the magenta color spectrum of visible light.

11. A display system according to claim 8, wherein said liquid crystal display panel in cooperation with its associated polarizers passes non-colored light and colored light, said colored light being substantially in the cyan color spectrum of visible light.

12. A display system according to claim 8, wherein one of said liquid crystal display panel in cooperation with its associated polarizers passes colored light, said colored light being substantially in the red color spectrum of visible light.

13. A display system according to claim 8, wherein said liquid crystal display panel in cooperation with its associated polarizers passes colored light, said colored light being substantially in the green color spectrum of visible light.

14. A display system according to claim 8, wherein said liquid crystal display panel passes colored light, said color light being substantially in the blue color spectrum of visible light.

15. A method for substantially optimizing distinguishable liquid crystal shading level pixel images produced by liquid crystal display panel means having a plurality of electrically operable pixel elements, comprising:

energizing said display panel means with a gray scaled drive signal, said drive signal causing said plurality of pixel elements to be energized to either a fully on selected state or a fully off deselected state;

said drive signal being duty cycled over a large number of frames to cause said plurality of pixel elements to produce pixel images having a large number of color shading levels;

said large number of color shading levels including a maximum color shading level and a minimum color shading level;

applying a select bias voltage signal to said panel means to facilitate maximizing substantially the luminance of each pixel image;

said plurality of electrically operable pixel elements being electrically energized by both said drive signal and said select bias voltage signal;

adjusting said select bias voltage signal to an optimum level to cause the pixel images produced by said plurality of pixel elements to exhibit substantially maximum luminance when said pixel elements are energized by said drive signal to said maximum color shading level;

whereby the color contrast between each of the said large number of color shading levels is substantially optimized.

16. A method according to claim 15 wherein said liquid crystal panel means includes a plurality of liquid crystal panels; and wherein the step of adjusting includes:

generating a plurality of test patterns, each individual test pattern consisting of a plurality of pixel images, each pixel image having substantially the same color shading level;

adjusting said select bias voltage signal for each panel until in response to a first test pattern for maximum luminance, said plurality of panels produce in combination noncolored light;

measuring the applied bias voltage for each panel at its saturated voltage level;

adjusting the applied bias voltage for each panel in response to eight test patterns for maximum luminance at a maximum shaded colored light;

measuring the applied bias voltage for each panel at its threshold voltage level;

adjusting the applied bias voltage for one selected panel until the panel in respond to a second test pattern for determining maximum luminance between its saturated voltage level and its threshold voltage level produces a maximum relative luminance;

measuring said maximum relative luminance resulting from said second test pattern and the applied bias voltage causing said panel to produce said maximum relative luminance;

recording the maximum relative luminance for said selected panel as a function of the applied bias voltage producing said maximum relative luminance in response to said second test pattern;

changing the test patterns sequentially;

measuring the maximum relative luminance for each sequential test pattern and the applied bias voltage causing said panel to produce said maximum relative luminance;

recording the maximum relative luminance for said selected panel as a function of applied bias voltage for producing said maximum relative luminance in response to each sequential test pattern;

selecting another panel in the system and repeating said adjusting, measuring and recording steps until gamma curves have been plotted for each respective panel in said panel construction; and adjusting the bias voltage applied to each panel to maximize the number of discrete color or shading levels between said saturation voltage and said threshold voltage, said adjustment being determined by the first shading level distinguishable from the shading level at said threshold voltage level.

* * * * *